(12) United States Patent
Holme et al.

(10) Patent No.: US 8,802,287 B2
(45) Date of Patent: Aug. 12, 2014

(54) QUANTUM DOT ULTRACAPACITOR AND ELECTRON BATTERY

(75) Inventors: Timothy P. Holme, San Francisco, CA (US); Friedrich B. Prinz, Woodside, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 645 days.

(21) Appl. No.: 12/657,198

(22) Filed: Jan. 15, 2010

(65) Prior Publication Data

US 2010/0183919 A1     Jul. 22, 2010

Related U.S. Application Data

(60) Provisional application No. 61/205,459, filed on Jan. 16, 2009, provisional application No. 61/211,746, filed on Apr. 1, 2009.

(51) Int. Cl.
*H01M 4/02* (2006.01)
*B82Y 10/00* (2011.01)

(52) U.S. Cl.
USPC .......................................... 429/209; 977/774

(58) Field of Classification Search
USPC .................................. 429/209; 977/774, 932
See application file for complete search history.

(56) References Cited

U.S. PATENT DOCUMENTS

| | | | |
|---|---|---|---|
| 5,414,588 A | 5/1995 | Barbee, Jr. et al. | |
| 5,906,670 A | 5/1999 | Dobson et al. | |
| 6,060,743 A | 5/2000 | Sugiyama et al. | |
| 6,137,192 A | 10/2000 | Staffiere | |
| 6,137,671 A | 10/2000 | Staffiere | |
| 6,477,035 B1 | 11/2002 | Cepas et al. | |
| 6,830,971 B2 | 12/2004 | Balakumar et al. | |

(Continued)

FOREIGN PATENT DOCUMENTS

DE      10053276        1/2002
EP      1414078 B1      4/2004

(Continued)

OTHER PUBLICATIONS

The Electronic Properties of Small Metal Particles: The Electric Polarizability, 1972, pp. 408-414, vol. 5, Journal of Physics C, Solid State Physics, Printed in Great Brittain.

(Continued)

*Primary Examiner* — Mark F Huff
*Assistant Examiner* — Monique Wills
(74) *Attorney, Agent, or Firm* — Lumen Patent Firm

(57) ABSTRACT

The present invention provides a solid-state energy storage device having at least one quantum confinement species (QCS), where the QCS can include a quantum dot (QD), quantum well, or nanowire. The invention further includes at least one layer of a dielectric material with at least one QCS incorporated there to, and a first conductive electrode disposed on a top surface of the at least one layer of the dielectric material, and a second conductive electrode is disposed on a bottom surface of the at least one layer of dielectric material, where the first electrode and the second electrode are disposed to transfer a charge to the at least one QCS, where when an electrical circuit is disposed to provide an electric potential across the first electrode and the second electrode, the electric potential discharges the transferred charge from the at least one QCS to the electrical circuit.

25 Claims, 7 Drawing Sheets

(56) References Cited

U.S. PATENT DOCUMENTS

| | | | |
|---|---|---|---|
| 6,867,449 B2 | 3/2005 | Marsh et al. | |
| 7,057,881 B2 | 6/2006 | Chow et al. | |
| 7,193,261 B2 | 3/2007 | Ilyanok | |
| 7,208,802 B2 | 4/2007 | Shimizu et al. | |
| 7,265,406 B2 | 9/2007 | Kellar et al. | |
| 7,268,411 B2 | 9/2007 | Shimizu et al. | |
| 7,295,419 B2 | 11/2007 | Chow et al. | |
| 7,323,398 B2 | 1/2008 | Akatsu | |
| 7,365,395 B2 | 4/2008 | Stumbo et al. | |
| 7,428,137 B2 | 9/2008 | Dowgiallo, Jr. | |
| 7,466,536 B1 | 12/2008 | Weir et al. | |
| 7,575,978 B2 | 8/2009 | Kraus et al. | |
| 7,662,731 B2 * | 2/2010 | Itoh et al. | 438/795 |
| 7,687,876 B2 | 3/2010 | Kabir | |
| 7,750,869 B2 | 7/2010 | Mosallaei | |
| 7,763,511 B2 | 7/2010 | Majhi et al. | |
| 2006/0007633 A1 | 1/2006 | Bhattacharyya | |
| 2006/0164788 A1 | 7/2006 | Eisenring | |
| 2006/0243655 A1 * | 11/2006 | Striemer et al. | 210/490 |
| 2006/0279905 A1 | 12/2006 | Chow et al. | |
| 2007/0007576 A1 | 1/2007 | Kim et al. | |
| 2007/0121274 A1 | 5/2007 | Talvacchio et al. | |
| 2008/0062614 A1 | 3/2008 | Goia | |
| 2008/0094775 A1 | 4/2008 | Sneh et al. | |
| 2008/0180883 A1 | 7/2008 | Palusinski et al. | |
| 2009/0047453 A1 | 2/2009 | Folaron et al. | |
| 2009/0090999 A1 | 4/2009 | Carver | |
| 2009/0096004 A1 | 4/2009 | Kawabata et al. | |
| 2009/0103235 A1 | 4/2009 | Oh | |
| 2009/0124483 A1 | 5/2009 | Lin et al. | |
| 2009/0195961 A1 | 8/2009 | Eisenring | |
| 2010/0068505 A1 | 3/2010 | Hartmut et al. | |
| 2010/0090663 A1 | 4/2010 | Pappas et al. | |
| 2010/0226066 A1 | 9/2010 | Sweeney et al. | |
| 2011/0275005 A1 * | 11/2011 | Zhu et al. | 429/482 |

FOREIGN PATENT DOCUMENTS

| | | |
|---|---|---|
| WO | WO 2008/071369 | 6/2008 |
| WO | WO 2008/100304 | 8/2008 |
| WO | WO 2008/118422 | 10/2008 |
| WO | WO 2010/023575 | 3/2010 |

OTHER PUBLICATIONS

Garcia Del Muro et al., "Metallic nanoparticles embedded in a dielectric matrix: growth mechanisms and percolation", 2008, Journal of Nanomaterlals.

Merrill et al., "Effective medium theories for artificial materials composed of multiple sizes of spherical Inclusions In a host conUnuum", 1999, pp. 142-148, IEEE Trans. Antennas and Propagation v47n1.

Dunn et al., "Rethinking Multifunction in Three Dimenslons for Miniaturizing Electrical Energy Storage", Fall 2008, The Electrochemical Society Interface.

* cited by examiner (a)

(b)

QUANTUM DOT ULTRACAPACITOR AND ELECTRON BATTERY

CROSS-REFERENCE TO RELATED APPLICATIONS

This application is cross-referenced to and claims the benefit from U.S. Provisional Application 61/205,459 filed Jan. 16, 2009, and to U.S. Provisional Application 61/211,746 filed Apr. 1, 2009, which are hereby incorporated by reference.

GOVERNMENT SPONSORSHIP

This invention was made with Government support under contract number W911NF-07-2-0027 awarded by the US Army RDECOM Acquisition Center. The Government has certain rights in this invention.

FIELD OF THE INVENTION

The invention relates generally to energy storage devices. More particularly, the invention relates to solid state capacitors and batteries.

BACKGROUND

Energy storage is a crucial component of a large number and variety of electronic devices, particularly for mobile devices and vehicles. Energy storage devices include capacitors, which store charge for later discharge through a circuit, and batteries, which rely on ions and chemical reactions to store and release energy. Existing energy storage devices have many disadvantages, including low energy storage density, slow charge/discharge performance, and high rates of degradation. For example, the low storage density in existing batteries typically requires design of large and heavy devices to store a sufficient amount of energy.

The size and weight requirements can reduce the performance of devices that a battery is powering, such as in hybrid or electric vehicles. Batteries have low storage density due to the large size and weight of the ions stored in the batteries. Transporting the ions in existing batteries also causes slow charge and discharge performance. Furthermore, the reliance of existing batteries on ionic transport causes high degradation rates of the batteries. Energy storage devices have been based on a wide variety of physical effects. For example, electric fields can be employed to store energy in capacitors, and chemical reactions (involving ion motion) can be employed to store energy in batteries. However, energy storage in a capacitor can be limited by the device geometry (e.g., 2-D capacitor plates having limited area), and batteries can have a slow response time due to the ion motion inherent in electrochemical reactions. Accordingly, it would be an advance in the art to provide energy storage having higher energy density than a capacitor, faster charge/discharge than a battery and/or much longer lifetime than a battery.

SUMMARY OF THE INVENTION

The present invention provides a solid-state energy storage device having at least one quantum confinement species (QCS), at least one layer of a dielectric material with at least one QCS incorporated with at least one layer of a dielectric material, and a first conductive electrode disposed on a top surface of the at least one layer of the dielectric material, and a second conductive electrode is disposed on a bottom surface of the at least one layer of dielectric material, where the first electrode and the second electrode are disposed to transfer a charge to the at least one QCS, where when an electrical circuit is disposed to provide an electric potential across the first electrode and the second electrode, the electric potential discharges the transferred charge from the at least one QCS to the electrical circuit.

According to one aspect of the invention, the QCS can include a quantum dot (QD), quantum well, or nanowire.

In another aspect, a charge rate of the solid energy storage device is defined according to the thickness of structures that can maintain a gap between at least two QCS, the thickness of a gap between at least one QCS and one electrode, an energy barrier between the QCS and the dielectric layer, or a dielectric constant of the at least one layer of the dielectric material.

In a further aspect of the invention, a discharge rate of the solid-state energy storage device is defined according to the thickness of structures that can maintain a gap between at least two QCS, the thickness of a gap between the at least one QCS and one electrode, an energy barrier between the QCS and the dielectric layer, or a dielectric constant of the at least one layer of the dielectric material In another aspect of the invention, a plurality of the QCS are arranged between the first electrode and the second electrode in a gradient pattern according to features that can include a size of the QCS or a material of the QCS. Additionally, a relatively large size the QCS in the gradient can include a quantum dot quantum well, nanowire and bulk material. According to this aspect a relatively large size QCS in the gradient includes a material having a first work function and the relatively small QCS in the gradient includes a second work function.

According to one aspect of the invention, a plurality of the QCS is arranged according to size, where a relatively large size of at least one QCS is surrounded by an array of relatively small size QCS. In this aspect, the relatively large size QCS can be a quantum dot, quantum well, nanowire or bulk material. Further, the relatively large size QCS includes a material having a first work function and the relatively small size QCS includes a second work function.

In another aspect of the invention, the QCS are arranged by material, where a material with a high work function is surrounded by an array of relatively low work function QCS.

In another aspect of the invention, the QCS are arranged by material, where a material with a low work function is surrounded by an array of relatively high work function QCS.

In another aspect of the invention, a plurality of QCS is arranged so as to have a gradient in work function.

In another aspect of the invention, a plurality of the QCS are arranged according to size, where a relatively small size QCS is surrounded by an array of relatively large size QCS. In this aspect, the relatively large size QCS can include a quantum dot, quantum well, nanowire or bulk material.

In a further aspect of the invention, the solid-state energy storage device includes at least two solid-state energy storage devices having electrical outputs disposed in series or in parallel.

In yet another aspect, at least one array of the QCS forms at least one functional layer on a surface of the at least one layer of the dielectric material. In this aspect, the functional layers may include different materials having different work functions, where the functional layers are disposed to form a chemical potential gradient between the first electrode and the second electrode. Here, the functional layers can include an array of QDs disposed in the dielectric layer, an array of quantum wells disposed in the dielectric layer, an array of nanowires disposed in the dielectric layer or bulk material disposed in the dielectric layer, or any combination thereof. Further, the functional layers can include a material having an electron affinity that is higher than an electron affinity of the at least one dielectric layer. According to the current aspect, at least one functional layer can be disposed on another functional layer. Additionally, at least one functional layer can be disposed in a first dielectric material and at least one other the functional layer can be disposed in at least a second dielectric material. Here, a barrier layer can be disposed between the functional layers. In this aspect, the QCS can be disposed in a size or material gradient.

According to a further aspect of the invention, at least one array of the QCS forms at least one functional layer between the at least one layer of the dielectric material.

In one aspect of the invention, a solid-state energy storage device is provided having at least one quantum confinement species (QCS) incorporated with at least one layer of a dielectric material, a first conductive electrode disposed on a top surface of the dielectric material and a second conductive electrode disposed on a bottom surface the dielectric material, where the first electrode and second electrode are disposed to polarize to the dielectric material and QCS.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Figure 1:
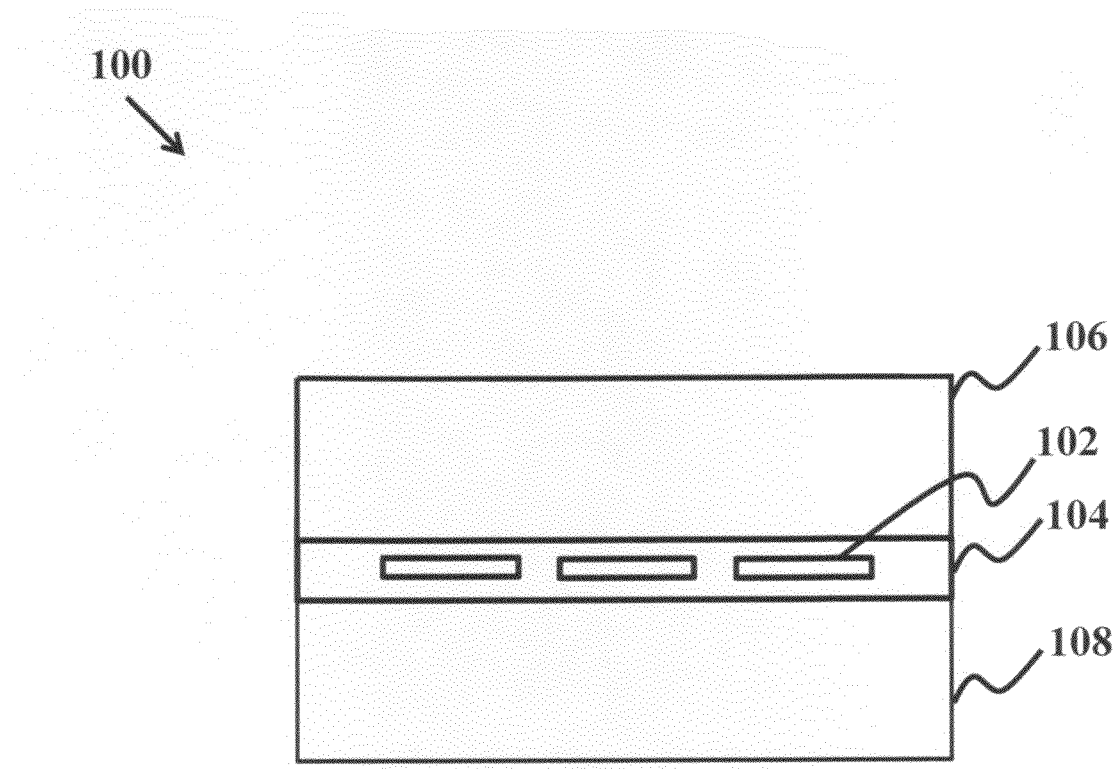
FIG. 1 shows a schematic view of a solid-state energy device according to the present invention.

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

The present invention is directed to solid-state energy storage devices that are able to overcome the above disadvantages of existing energy storage devices. A device of the present invention includes one or more quantum confinement structures (QCS) embedded in a dielectric material or disposed on the surface of the dielectric material and is enclosed by conductive electrodes, such as two or more metal electrodes. When the electrodes are charged, at least some of the charge is transferred to the QCS. Further, the electrode charge induces polarization in the dielectric material and the QCS. When the electrodes are disconnected from the charging circuit, some of the charge remains in the QCS and can be stored for later discharge. By applying an appropriate electric potential across the electrodes, the QCS may be discharged, which causes current to flow.

It is important to note that the present invention is directed to a capacitor and an electron battery having very high storage density. Because the energy storage devices of the present invention use QDs to store electrons instead of ions, small and light devices with high storage capacities are provided. Furthermore, electron transport allows for fast charge and discharge. The solid-state devices of the present invention also have improved degradation properties over existing energy storage devices. In the present approach, energy storage is via electrons in bulk, as opposed to surface charges (e.g., capacitors) or ions (e.g., batteries).

In embodiments of the present invention, the charge and discharge rates and storage capacities of the devices are tunable. Charge and discharge rates depend on the gaps between QDs and the dielectric constant of the dielectric material, therefore the rates can be altered by changing the distances between QDs, the dielectric constant, or a combination thereof. Charge and discharge rates further depend upon the electron affinity of the dielectric material and of the QDs.

In one embodiment, an energy storage device has QCS of varying sizes. Preferably, large QCS are placed near one electrode and smaller QCS are placed near an opposing electrode. Charge is preferentially stored in the larger QCS. The gradient in the size distribution allows polarization of the QCS, even when the cell is neutral, i.e. a larger QCS is polarized due to its proximity to a smaller QCS. When the device is charged, the excess charge is preferentially contained in the larger dot, thereby increasing the stored charge. In another embodiment, an array of smaller QCS is arranged around a larger QCS. Alternatively, a smaller QCS can be surrounded by an array of larger QCS. It is noted that the QCS can have a wide range of sizes. In particular, in certain embodiments the larger QCS can be replaced by a nanowire or a quantum well and/or the smaller QCS can be as small as an individual atom.

In another preferred embodiment, an energy storage device can include multiple repeating units connected to each other, such as by stacking the units on top of each other. Each of the units is capable of storing an amount of charge by itself, therefore the device with multiple repeating units is capable of storing a larger amount of charge. Since the voltage of these units stacked in series is additive, and the energy density scales with the square of the voltage, a much higher energy density can be achieved in this embodiment.

In another embodiment, the arrangement QDs are made of different materials. Additionally, a first QD can be made from a material with a greater work function than a second QD. Electron transfer results from the Fermi level difference between materials in proximity, so a greater polarization can be achieved with a greater difference in Fermi level.

According to further embodiments of the present invention, improved energy storage can be provided by disposing conductive electrodes on either side of an insulating matrix. One or more functional layers are disposed in the insulating matrix, separated from each other by thin (about 1 nm to 25 nm) insulating layers through which tunneling can occur or by thick (about 10 nm to 700 nm) insulating layers that are highly resistive to electrical current. The functional layers may contain QCS that have different Fermi levels to create a chemical potential gradient. Further, the functional layers may be quantum-confined, as in quantum wells, nanowires or quantum dots. Such quantum confinement can provide a way to adjust the Fermi level of the functional layers. Functional layers can be metallic or be semiconductors and can contain embedded QCS having an electron affinity that is higher than the electron affinity of the insulating matrix. The insulating matrix materials should have a high breakdown voltage. Several functional layers can be stacked on top of each other.

Electron tunneling creates a balancing electric potential gradient so that the electrochemical potential is constant in equilibrium. When a voltage of a certain polarity is applied to the device, it can cancel out the equilibrium chemical potential to force electrons into the higher Fermi level material (i.e., a charging current flows). When the voltage is removed, some charge may persist in the functional layer(s). This is the charged state of the device. When a discharge current is drawn from the device, the voltage of the electrodes is reduced, and the stored charge will flow to the lower Fermi energy material. This is the discharge cycle, and the electron flow between functional layers and from the functional layers to the electrodes will contribute current.

Applications of the current invention include electric vehicle energy storage (EV or PHEV battery), portable electronics (laptop, cell phone, etc.), and troop gear/weapons, where the advantages include high energy density storage (possibly greater than 250 Whr/kg), high power density storage (~$10^8$ W/kg), fast charge/discharge rate, and low degradation over time because there are no chemical reactions. Further advantages include no moving atoms/ions, and no risk of catastrophic, unsafe failure.

Referring now to the drawings, FIG. 1 shows a schematic view of the solid-state energy storage device 100 according to the current invention. As shown, the solid-state energy storage device 100 includes at least one quantum confinement species (QCS) 102, at least one layer of a dielectric material 104 with at least one QCS 102 incorporated with at least one layer of a dielectric material 104, and a first conductive electrode 106 disposed on a top surface of the at least one layer of the dielectric material 104, and a second conductive electrode 108 is disposed on a bottom surface of the at least one layer of dielectric material 104, where the first electrode 106 and the second electrode 108 are disposed to transfer a charge to the at least one QCS 102, where when an electrical circuit is disposed to provide an electric potential across the first electrode 106 and the second electrode 108, the electric potential discharges the transferred charge from the at least one QCS 102 to the electrical circuit.

Figure 2:
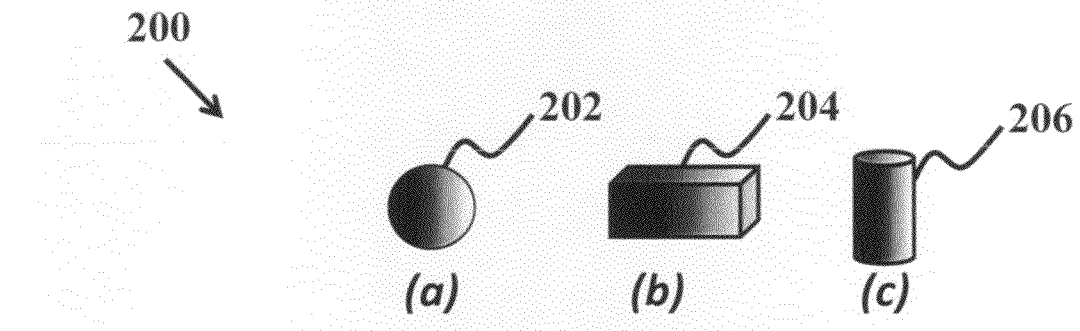
FIGS. 2a-2c show different quantum confinement species according to the present invention.

FIGS. 2a-2c show different quantum confinement species 200 according to the current invention, where FIG. 2a shows a quantum dot (QD) 202, FIG. 2b shows a quantum well 204, and FIG. 2c shows a nanowire 206.

According to the current invention, a charge rate or a discharge rate of the solid energy storage device 100 is defined according to device structures that can include a gap between at least two QCS 102, a gap between at least one QCS 102 and one electrode 106/108, an energy barrier between the QCS 102 and the dielectric layer 104, or a dielectric constant of the at least one layer of the dielectric material 104.

Figure 3:
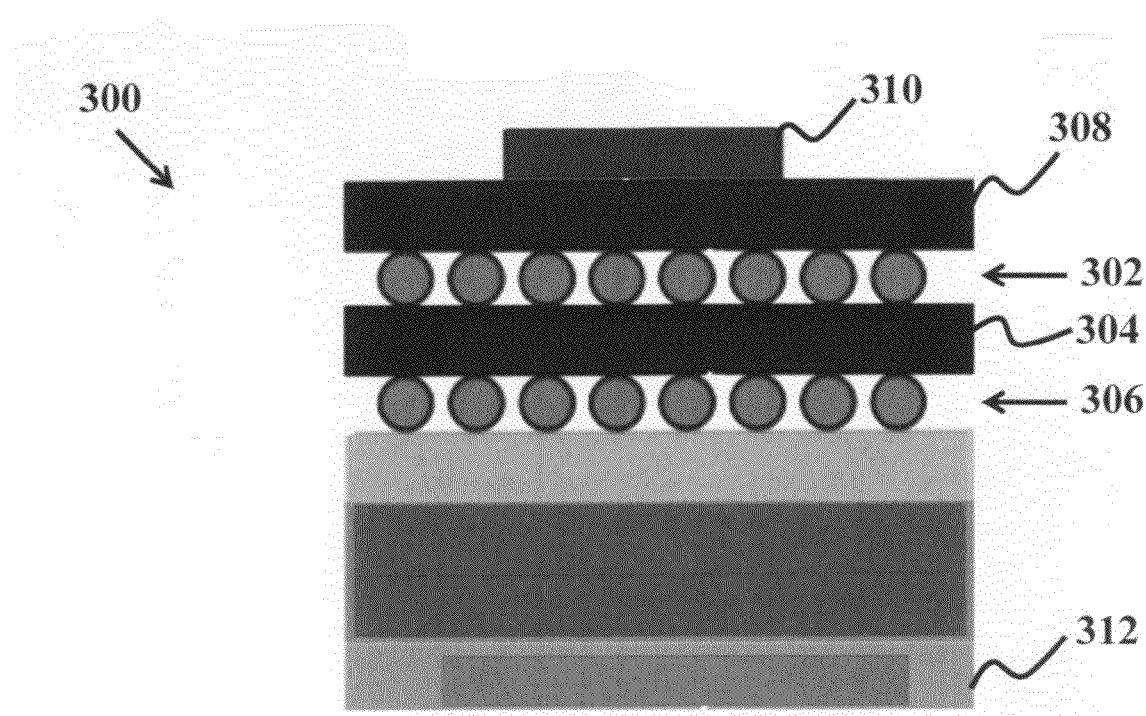
FIGS. 3a-3b show a solid-state energy device embedded with QCS according to the present invention.
Figure 3:
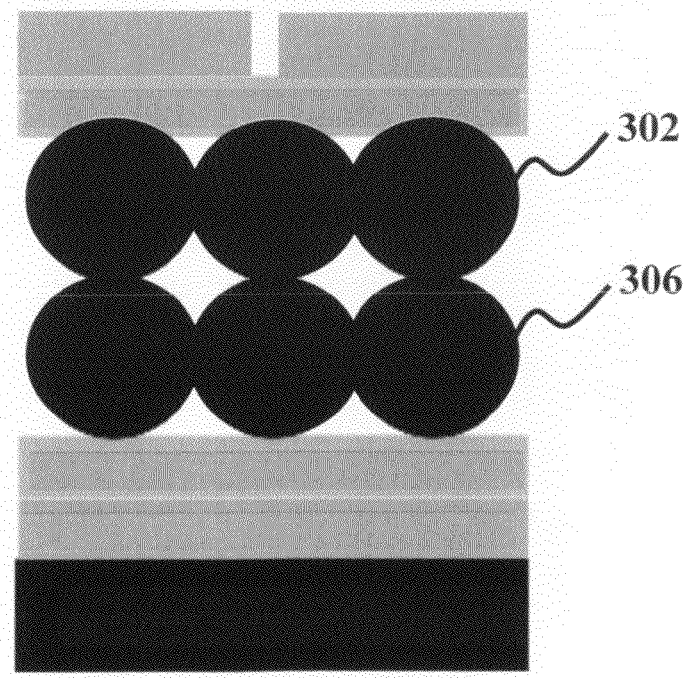
Figure 6:
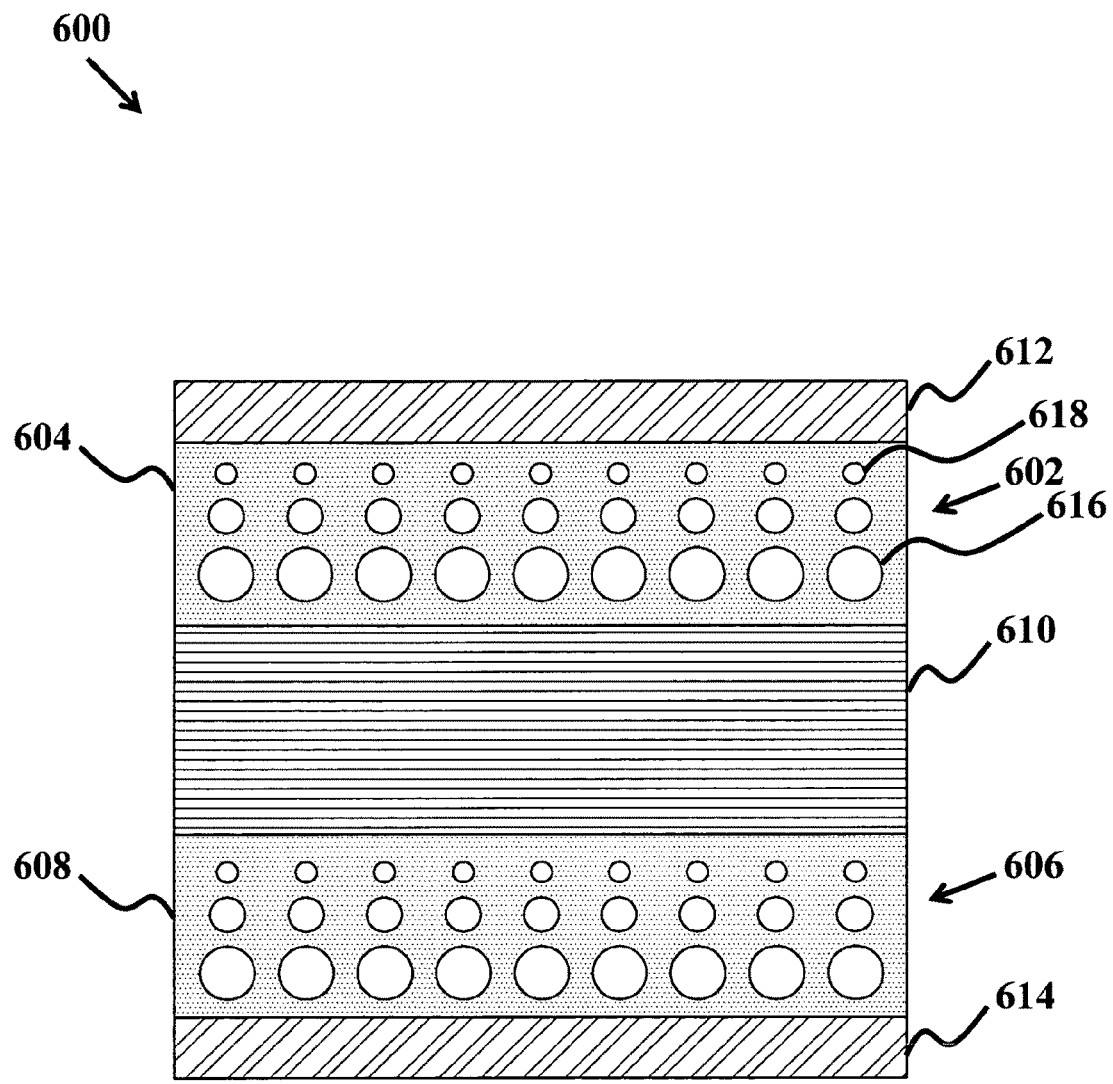
FIG. 6 shows a solid energy storage device with two functional layers with gradient patterned QCS and a barrier, where the functional layers have gradient patterned QCS according to the present invention.

In one embodiment of the invention, FIGS. 3a-3b show QCS embedded in the solid-state energy device 300 on a surface of the at least one layer of the dielectric material 304/308. In this aspect, the different layers containing QCS 302/306 include different materials having different work functions, where the QCS layers 302/306 are disposed to form a chemical potential gradient between the first electrode 310 and the second electrode 312. It is understood that at least one QCS layer 302 can be disposed in a first dielectric material 304 and at least one other the QCS layer 306 can be disposed in at least a second dielectric material 308. According to the current invention, the QCS layers 302/306 can include i) an array of QDs disposed in the dielectric layer, ii) an array of quantum wells disposed in the dielectric layer, iii) an array of nanowires disposed in the dielectric layer and iv) bulk material disposed in the dielectric layer or any combination thereof. Further, the QCS layers 302/306 can include a material having an electron affinity that is higher than an electron affinity of the at least one dielectric layer 304/308, where the bandgap of the at least one dielectric layer 304/308 can be above 2 eV and preferably above 3 eV. According to the current aspect, at least one QCS layer 302/306 can be disposed on another QCS layer as shown in FIG. 3b. In this aspect, the QCS can be disposed in a size or material gradient, as shown in FIG. 6.

Figure 4:
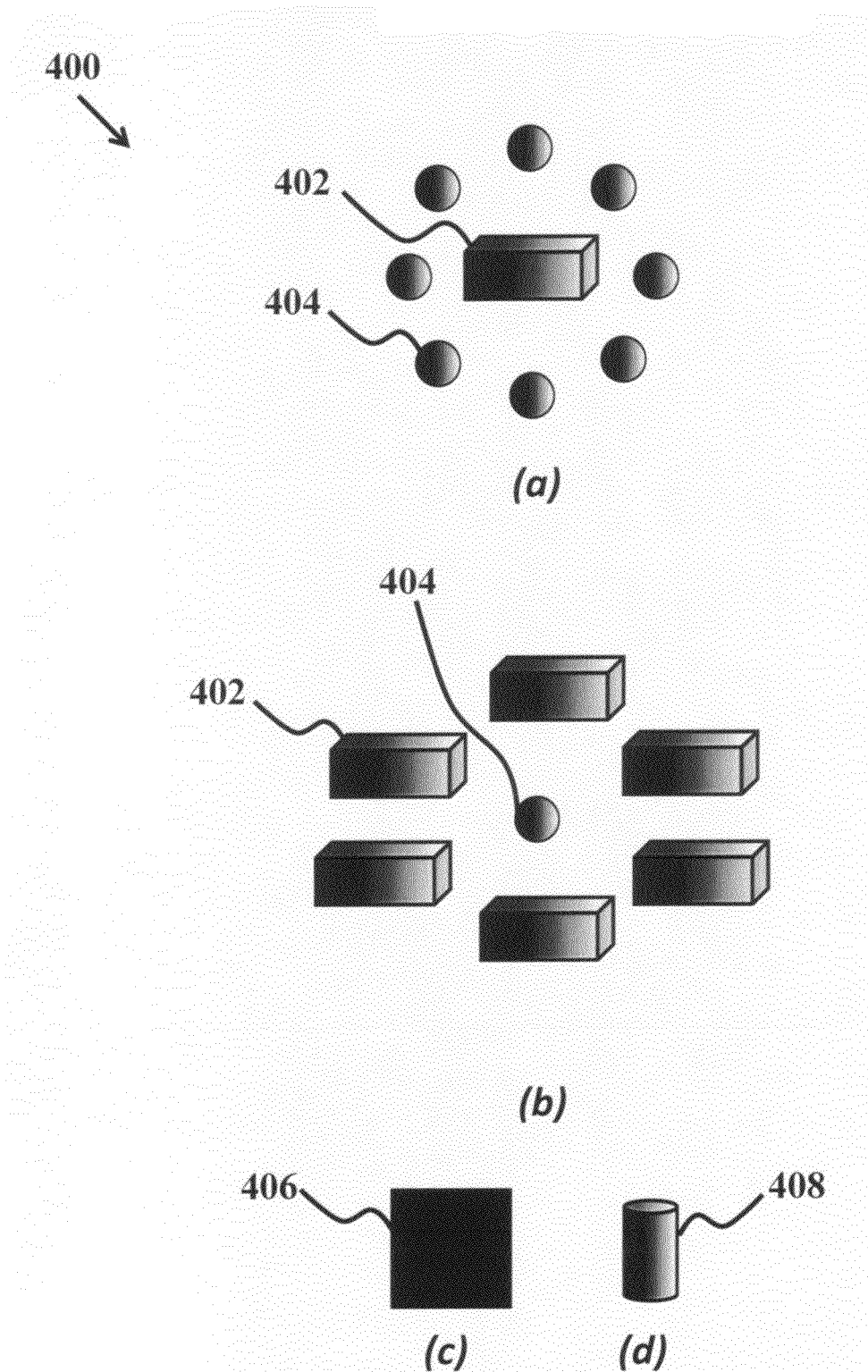
FIGS. 4a-4d show embodiments of the QCS arranged according to size according to the present invention.

The QCS can be arranged by material, where a material with a high work function is surrounded by an array of relatively low work function QCS. Alternatively, a material with a low work function can be surrounded by an array of relatively high work function QCS. Also, a plurality of QCS can be arranged so as to have a gradient in work function. According to another embodiment of the invention, FIGS. 4a-4b show embodiments of the QCS arranged according to size 400, where FIG. 4a shows a relatively large size QCS 402 is surrounded by an array of relatively small size QCS 404. The relatively large size QCS 402 includes a material having a first work function $\phi_l$ and the relatively small size QCS 404 includes a second work function $\phi_s$, where according to one embodiment, the first workfunction $\phi_l$ is larger than the second workfunction $\phi_s$. As shown in FIG. 4b, another embodiment of the invention includes a relatively small size QCS 404 surrounded by an array of relatively large size QCS 401. In the embodiments shown in FIGS. 4a and 4b, the relatively large size QCS 402 can include a quantum dot 404, quantum well 402, bulk material 406 or nanowire 408 as shown in FIGS. 4c and 4d.

Figure 5:
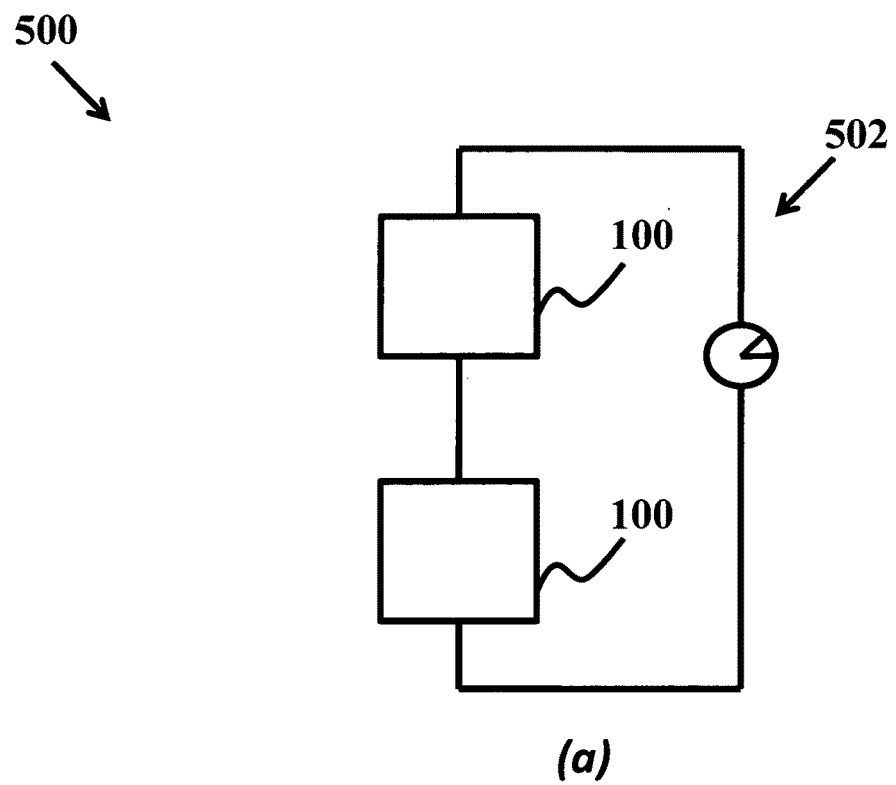
FIGS. 5a-5b show circuit diagrams of the solid-state energy devices arranged in series and in parallel according to size according to the present invention.
Figure 5:
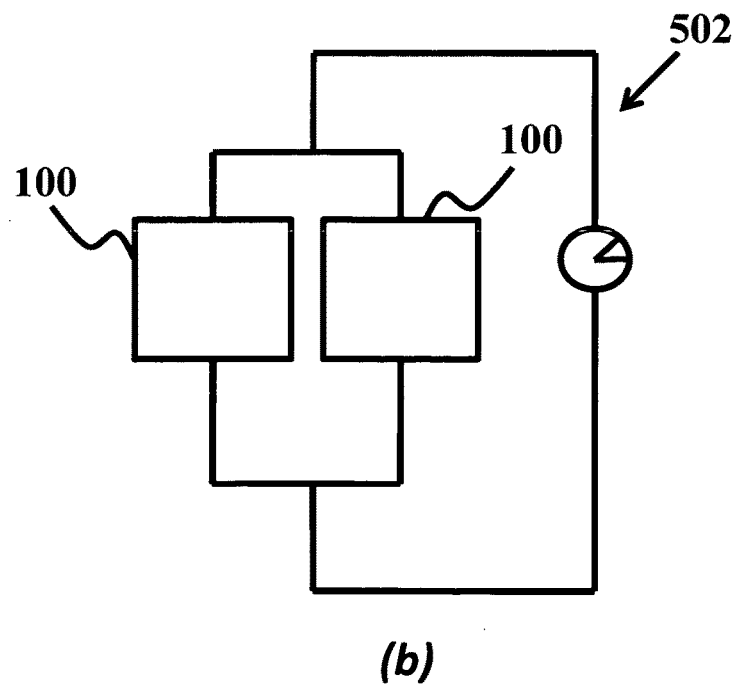

FIGS. 5a-5b show circuit diagrams of the solid-state energy devices arranged in series and in parallel. In one embodiment of the invention, the solid-state energy storage device includes at least two solid-state energy storage devices 100 having electrical outputs 502 disposed in series as shown in FIG. 5a or in parallel shown in FIG. 5b.

In one embodiment of the invention, a plurality of the QCS are arranged between the first electrode and the second electrode in a gradient pattern according to features that can include a size of the QCS or a material of the QCS, where a polarization of charge exists across the gradient between the first electrode and the second electrode. FIG. 6 shows an exemplary size gradient-patterned QCS solid energy storage device 600 according to the current invention, where in this example shown are QD size gradients in functional layers 602/606 disposed within relatively thin dielectric layers 604/608, where the QD gradients in the dielectric layers 604/608 form functional layers having a thickness in a range of 3 Å to 300 μm. It is understood that the QCS in the functional layers can be QD's, quantum wells, nanowires, or bulk materials. FIG. 6 further shows a relatively thick insulating layer 610 having a thickness in a range of 1 nm to 500 μm and having a relatively high electron affinity, relatively high bandgap and relatively high breakdown voltage. Layer 610 is disposed between the two relatively thin dielectric layers 304/308, which have a thickness in a range of 0.3 nm to 300 μm. The insulating layer 610 is an optional layer to the solid energy storage device 600. The bandgap of layer 610 may be above 1 eV and is preferably above 4 eV. The breakdown field is preferably above 1 MV/cm and more preferably above 3 MV/cm. A first electrode 612 has a relatively small work function $\phi_s$ and is disposed on the top surface of the first relatively thin dielectric layer 604, where the relatively small work function $\phi_s$ may be below 4 eV and preferably below 3 eV. Some exemplary materials useful for the first electrode 612 having a relatively small work function $\phi_s$ can include Zn, Li, Na, Mg, K, Ca, Rb, Sr, Ba, Cs, doped diamond and Y, to name a few. A second electrode 614 has a relatively large work function $\phi_l$ and is disposed on the bottom surface of the second relatively thin dielectric layer 606, where the relatively large work function $\phi_l$ may be above 4.5 eV and preferably above 5.5 eV. Some exemplary materials useful for the second electrode 312 having a relatively large work function $\phi_l$ can include Au, Pt, W, Al, Cu, Ag, Ti, Se, Ge, Pd, Ni, Co, Rh, Ir and Os, to name a few. Size gradient of quantum confined active layers are highly polarizable using high density of state (DOS) materials such as Ni, Pt, Cu, Ag, Au and Ir to name a few. The current invention provides QCS that are chemically stable in the matrix material (e.g. doesn't oxidize if the matrix material is an oxide). Some examples of materials useful for the dielectric layers include, but are not limited to $Al_2O_3$, Si, $TiO_2$, Ti-nitride, Ti-oxynitride, Ge, ZnO, $ZrO_2$, $HfO_2$, $SiO_2$, $Si_3N_4$, $Y_2O_3$, $BaTiO_3$, SrO, $SrTiO_3$, and combinations thereof According to the current invention, examples of materials useful for the QCS can include metals such as Pt, Au, Ni, Ag, W, Ti, Al, Cu, Pd, Cs, Li, Na, K, Y, Sr and Ba. Further examples of materials useful for the QCS can include low bandgap semiconductors such as PbSe, PbS, ZnS, CdSe, CdS, ZnSe, Ge, Si, Sn and conductive oxides such as $RuO_2$. The relatively thick insulating layer 610 having a relatively high bandgap and relatively high breakdown voltage can be made from materials such as ZnS, $TiO_2$, $Al_2O_3$, $ZrO_2$, $Y_2O_3$, $HfO_2$, $Si_3N_4$, $SiO_2$, other oxides, nitrides, sulfides, selenides, to name a few. According to the current embodiment, a continuous change in a work function across the size gradient 602/606 is provided. Additionally, a relatively large size QCS 616 in the gradient can include a quantum well, nanowire and bulk material, where the relatively large size QCS 616 may have a smallest dimension as large as effectively a bulk material, for example over 3 nm to 10 nm for metals and over 40 nm for some semiconductors, or is at least larger than a relatively small QCS, according to one embodiment. According to this aspect a relatively large size QCS 616 in the gradient 602/606 includes a material having a first work function and the relatively small QCS 618 in the gradient 602/606 includes a second work function, where the relatively small QCS 618 can have a smallest dimension from one atom to 3-10 nm for metals, and up to 40 nm for semiconductors according to one embodiment.

Figure 7:
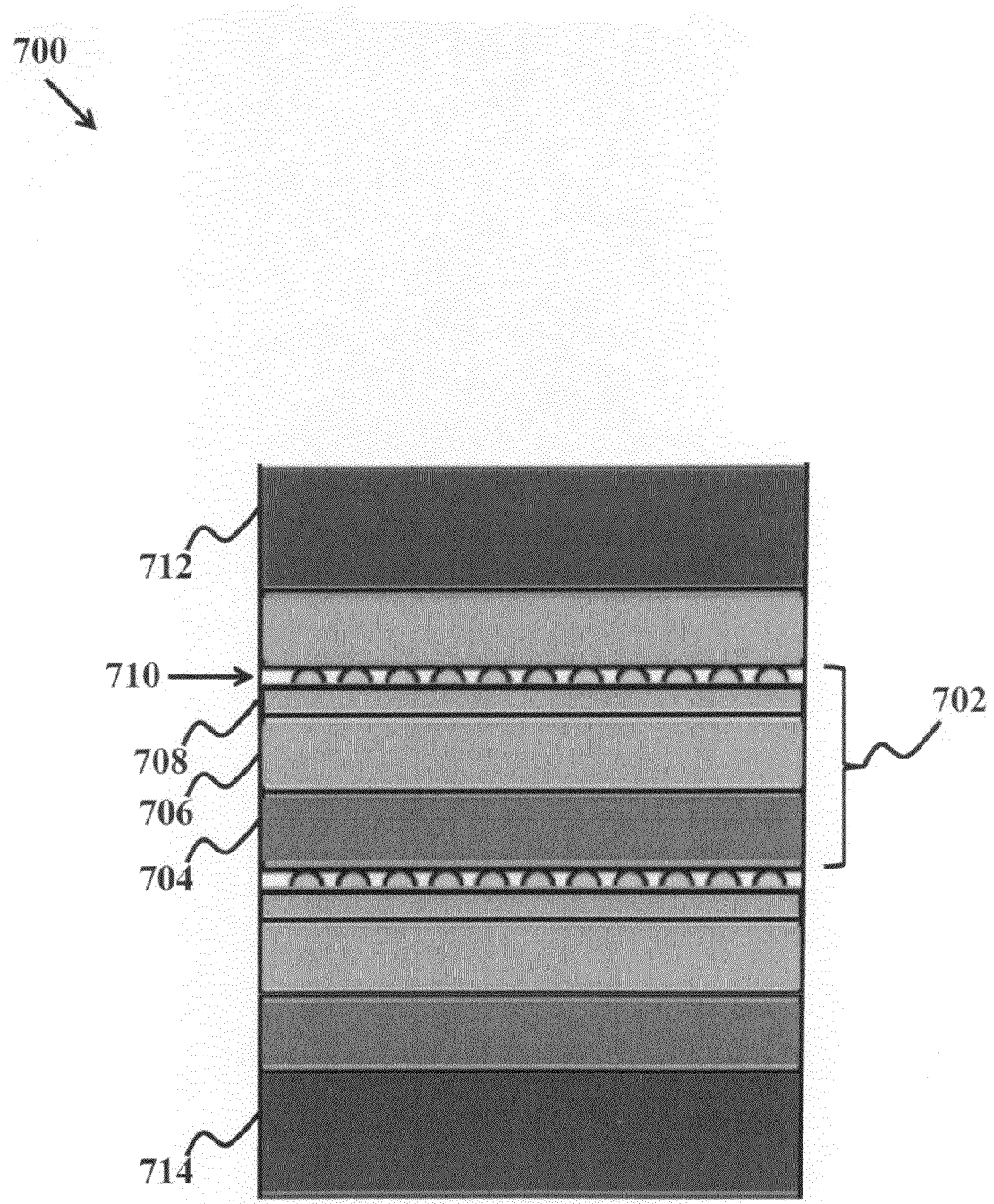
FIG. 7 shows a repeating stack solid-state energy device according to the present invention.

In another embodiment of the current invention, FIG. 7 shows a repeating stack solid-state energy device 700. Here the stack 702 of the solid-state energy device can include a dielectric layer 704, a quantum well layer 706 disposed on the dielectric layer 704, a relatively thin dielectric layer 708 disposed on the quantum well layer 706, and an array of relatively ultra small QD's 710 disposed on the a relatively thin dielectric layer 708. Here, two stacks of 702 are shown, but it is understood that the stack may be repeated arbitrarily many times between the electrodes 712/714.

Figure 8:
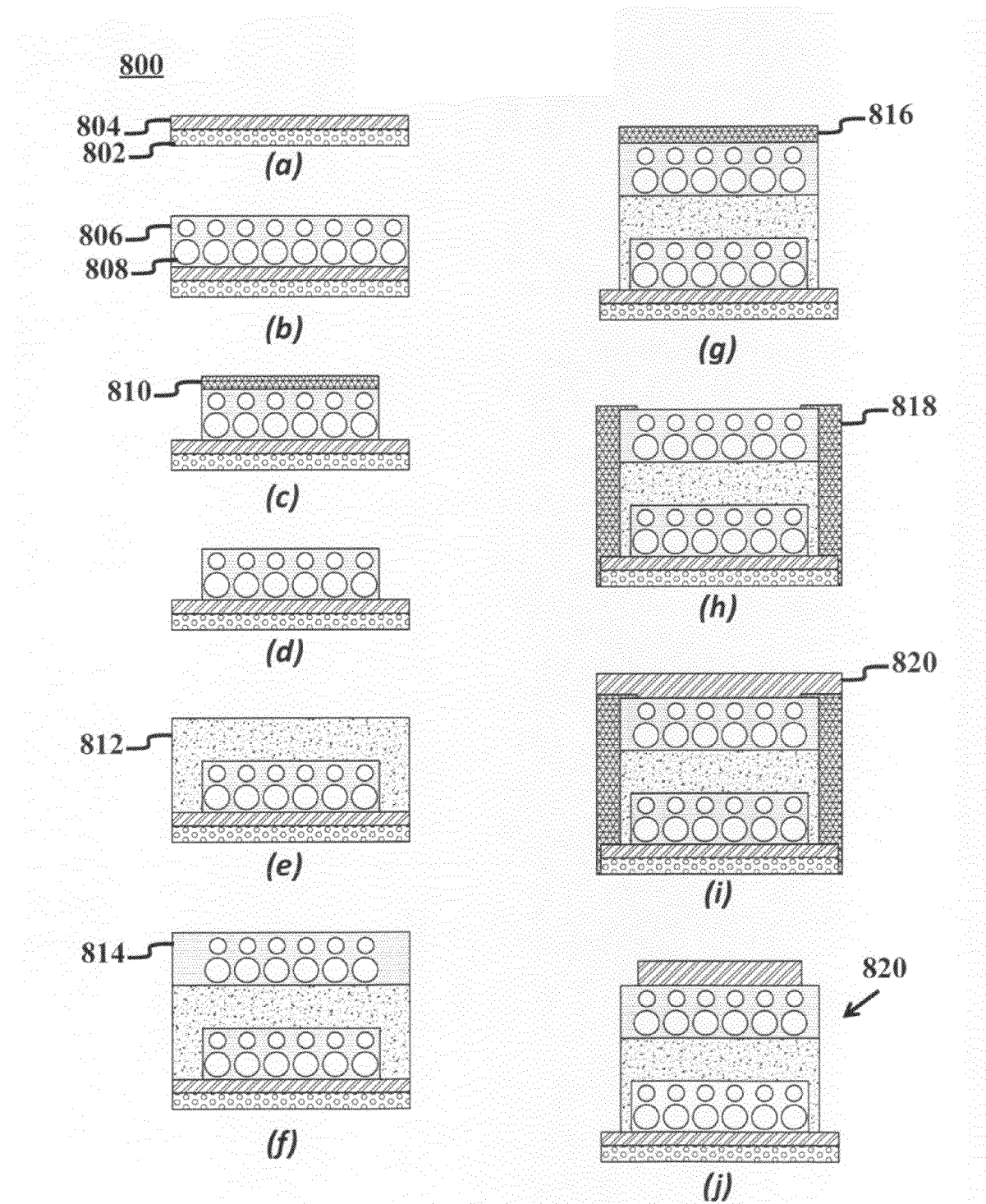
FIGS. 8a-8j show the steps for fabricating a solid-state energy device according to the present invention.

In another embodiment of the invention, FIGS. 8a-8j show a possible sequence of steps for fabricating 800 a solid-state energy device. As will be apparent to ones familiar with the art, many variations of steps and methods are possible, where the following exemplary sequence is provided. As shown in FIG. 8a, a substrate 802, such as glass, is cleaned and a back electrode 804 is deposited on it using sputter coating, evaporation or spin coating. Alternatively, a metal foil may be used as a substrate. The assembly is cleaned and a 10 nm to 200 nm active layer 806 of QCS structures 808 is deposited using atomic layer deposition (ALD), as shown in FIG. 8b. FIG. 8c shows the next step of providing a mask layer 810 on the active layer 806 and etching the active layer 808 in a desired shape or pattern, where FIG. 8d shows the mask 810 layer removed and the structure is cleaned. FIG. 8e shows the step of using CVD or PVD to deposit a 100 nm to 500 nm insulating layer 812 that is cleaned and optionally planarized. FIG. 8f shows the step of using ALD to deposit another 10 nm to 200 nm active layer 814 on the insulating layer 812b. The structure is provided another masking layer 816 and etched, as shown FIG. 8g, where the mask layer is then removed for the next step and the structure is cleaned. FIG. 8h shows a metal lift-off mask layer 818 is deposited from the base to the top of the structure, and a top electrode 820 is deposited using sputtering, evaporation or spin coating, as shown in FIG. 8i. FIG. 8j shows the metal lift off layer 818 is removed and the final structure 821 is cleaned for dicing and wire-bonding.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example the size gradient QCS may be combined with a material with a material gradient, and they may arranged in any fashion. As a second example, the QCS may take any shape such as a sphere, cone, pyramid, or approximately two-dimensional shape such as a triangle or circle.

All such variations are considered to be within the scope and spirit of the present invention as defined by the following claims and their legal equivalents.

What is claimed:

1. A solid-state energy storage device, comprising:
   a. at least one quantum confinement species (QCS);
   b. at least one layer of a dielectric material, wherein said at least one QCS is incorporated within said at least one layer of a dielectric material; and
   c. a first conductive electrode disposed on a top surface of said at least one layer of said dielectric material and a second conductive electrode disposed on a bottom surface of said at least one layer of dielectric material, wherein said first electrode and said second electrode are configured to transfer an electronic charge to or from said at least one QCS, and wherein said energy storage device is configured to provide electrostatic energy storage.

2. The solid-state energy storage device of claim 1, wherein said QCS is selected from the group consisting of a quantum dot (QD), quantum well, and nanowire.

3. The solid-state energy storage device of claim 1, wherein a charge rate of said solid energy storage device is defined according to criteria selected from the group consisting of a thickness of a gap between at least two said QCS, a thickness of a gap between said at least one said QCS and one said electrode, an energy barrier between said QCS and said dielectric layer, and a dielectric constant of said at least one layer of said dielectric material.

4. The solid-state energy storage device of claim 1, wherein a discharge rate of said solid-state energy storage device is defined according to criteria selected from the group consisting of a thickness of a gap between at least two said QCS, a thickness of a gap between said at least one said QCS and one said electrode, an energy barrier between said QCS and said dielectric layer, and a dielectric constant of said at least one layer of said dielectric material.

5. The solid-state energy storage device of claim 1, wherein said at least one QCS is arranged between said first electrode and said second electrode in a gradient pattern including two or more QCS and according to features selected from the group consisting of a size of said QCS and a material of said QCS.

6. The solid-state energy storage device of claim 5, wherein a continuous change in a work-function across said size gradient is provided.

7. The solid-state energy storage device of claim 5, wherein a first QCS in said gradient has a larger size than a second QCS in said gradient, and wherein said first QCS is selected from the group consisting of a quantum dot, quantum well, nanowire and bulk material.

8. The solid-state energy storage device of claim 5, wherein a first QCS in said gradient has a larger size than a second QCS in said gradient, wherein the first QCS comprises a material having a first work function and wherein the second QCS comprises a material having a second work function.

9. The solid-state energy storage device of claim 1, wherein said at least one QCS includes two or more QCS arranged according to size, wherein a first QCS has a larger size than one or more second QCS, and wherein the first QCS is surrounded by an array of second QCS.

10. The solid-state energy storage device of claim 9, wherein said first QCS is selected from the group consisting of a quantum dot, a quantum well, nanowire and bulk material.

11. The solid-state energy storage device of claim 9, wherein said first QCS comprises a material having a first work function and said second QCS comprises a material having a second work function.

12. The solid-state energy storage device of claim 1, wherein said at least one QCS includes two or more QCS arranged according to size, wherein a first QCS has a smaller size than one or more second QCS, and wherein the first QCS is surrounded by an array of second QCS.

13. The solid-state energy storage device of claim 12, wherein said second QCS is selected from the group consisting of a quantum dot, quantum well, nanowire and bulk material.

14. A solid state energy storage device comprising two or more solid state energy storage devices according to claim 1 having electrical outputs disposed in series or in parallel.

15. The solid-state energy storage device of claim 1, wherein said at least one QCS includes two or more QCS arranged in an array of QCS, wherein the array of said QCS forms at least one functional layer on a surface of said at least one layer of said dielectric material.

16. The solid-state energy storage device of claim 15, wherein said functional layers comprise different materials having different work functions, wherein said functional layers are disposed to form a chemical potential gradient between said first electrode and said second electrode.

17. The solid-state energy storage device of claim 15, wherein said functional layers are selected from the group consisting of: an array of QDs disposed in said dielectric layer, an array of quantum wells disposed in said dielectric layer, an array of nanowires disposed in said dielectric layer, and bulk materials disposed in said dielectric layer.

18. The solid-state energy storage device of claim 15, wherein said functional layers comprise a material having an electron affinity that is lower than an electron affinity of said at least one dielectric layer.

19. The solid-state energy storage device of claim 15, wherein at least one said functional layer is disposed on another said functional layer.

20. The solid-state energy storage device of claim 15, wherein at least one said functional layer is disposed in a first dielectric material and at least one other said functional layer is disposed in at least a second dielectric material.

21. The solid-state energy storage device of claim 15, wherein a barrier layer is disposed between said functional layers.

22. The solid-state energy storage device of claim 15, wherein said QCS are disposed in a size or material gradient.

23. The solid-state energy storage device of claim 1, wherein at least one array of said QCS forms at least one functional layer between said at least one layer of said dielectric material.

24. A solid-state energy storage device, comprising:
  a. at least one quantum confinement species (QCS);
  b. at least one layer of a dielectric material, wherein said at least one QCS is incorporated with said at least one layer of a dielectric material; and
  c. a first conductive electrode disposed on a top surface of said at least one layer of said dielectric material and a second conductive electrode disposed on a bottom surface of said at least one layer of dielectric material, wherein said first electrode and said second electrode are disposed to polarize said at least one layer of dielectric material and said QCS by electron tunneling between said QCS, and wherein said energy storage device is configured to provide electrostatic energy storage.

25. The solid-state energy storage device of claim 1, wherein said QCS are configured to permit electron tunneling between two or more of said QCS.

* * * * *